United States Patent
Houston et al.

[11] Patent Number: 5,079,604
[45] Date of Patent: Jan. 7, 1992

[54] SOI LAYOUT FOR LOW RESISTANCE GATE

[75] Inventors: Theodore W. Houston, Richardson; Terence G. W. Blake, Dallas, both of Tex.

[73] Assignee: Texas Instruments Incorporated, Dallas, Tex.

[21] Appl. No.: 708,117

[22] Filed: May 29, 1991

Related U.S. Application Data

[63] Continuation of Ser. No. 488,331, Mar. 2, 1990, abandoned.

[51] Int. Cl.[5] ............... H01L 27/01; H01L 27/12; H01L 27/10; H01L 29/06
[52] U.S. Cl. ................................. 357/237; 357/4; 357/45; 357/56; 357/59
[58] Field of Search .................... 357/23.7, 4, 56, 45

[56] References Cited

U.S. PATENT DOCUMENTS

| | | | |
|---|---|---|---|
| 4,809,044 | 2/1989 | Pryor et al. | 357/56 |
| 4,809,056 | 2/1989 | Shirato et al. | 357/71 |
| 4,899,202 | 2/1990 | Blake et al. | 357/4 |
| 4,905,062 | 2/1990 | Esquivel et al. | 357/45 |
| 4,914,491 | 4/1990 | Yu | 357/23.7 |
| 4,918,498 | 4/1990 | Plus et al. | 357/23.7 |

Primary Examiner—Andrew J. James
Assistant Examiner—Cynthia S. Deal
Attorney, Agent, or Firm—Stanton C. Braden; Richard L. Donaldson; William E. Hiller

[57] ABSTRACT

Silicon-on-insulator mesa steps cause high resistance in polycrystalline material because of the lack of silicide coverage. In a gate or word line, for instance, this accounts for a large resistance. By connecting the mesas through the body nodes of adjacent transistors, all mesa steps in a polycrystalline semiconductor gate are eliminated. Thus, gate or word line resistance is reduced.

6 Claims, 3 Drawing Sheets

SOI LAYOUT FOR LOW RESISTANCE GATE

This application is a continuation of application Ser. No. 07/488,331, filed Mar. 2, 1990, now abandoned.

BACKGROUND OF THE INVENTION

Conventional forming of a transistor in a mesa isolated silicon-on-insulator (SOI) structure has involved a mesa edge at the edge of the transistor and has required the gate material to cover the step at the mesa edge. This results in step coverage problems in the gate material and can also increase the gate resistance. Additionally, transistor leakage can occur at the edge of the transistor.

FIG. 1 illustrates a three-dimensional view of a prior art mesa-isolated SOI structure which is susceptible to the afore mentioned problems. As shown, polycrystalline semiconductor material, such as, polycrystalline silicon (hereinafter referred to as poly) 2 is placed in a step-like fashion over each mesa 4 which is patterned out of single crystalline silicon or other semiconductor material. Silicide 6 is grown over poly 2 in order to reduce the surface resistance of a gate, for a field effect transistor formed of the silicided polycrystalline silicon. Alternatively, other metal could be placed over poly 2. The mesas overlie insulator 5 such as silicon dioxide which may overlie semiconductor material such as silicon 7. Each mesa includes a source/drain region 8 and a body region (view obscured by poly 2). The source/drain region of the mesa is capable of serving as either a transistor source or a transistor drain. The body region is capable of serving as the body of a transistor. Body is a term commonly used in the SOI art to refer to the substrate of a field effect transistor between the source and drain which lies underneath the gate. Silicide 6 may not uniformly cover poly 2 at a step region 10 where poly 2 is substantially vertical, thereby leading to increased gate resistance. The structure illustrated in Figure is also susceptible to current leakage at the edge of each mesa 4 through the mechanism of a current path from region 8 on one mesa to region 8 on another mesa along a vertical edge 12 of poly 2.

OBJECT OF THE INVENTION

It is an object of the invention to provide a new and improved transistor in a mesa isolated silicon-on-insulator structure.

It is another object of the invention to eliminate step coverage problems in a mesa isolated silicon-on-insulator structure.

These and other objects of the invention, together with the features and advantages thereof, will become apparent from the following detailed specification when read together with the accompanying drawings in which applicable reference numerals have been carried forward.

SUMMARY OF THE INVENTION

The foregoing objects of the invention are accomplished by extending a mesa from the body node of a first transistor to the body node of a second transistor so that the mesa forms a substantially planar surface under the common gate of the first and second transistors.

DETAILED DESCRIPTION OF THE INVENTION

Figure 1:
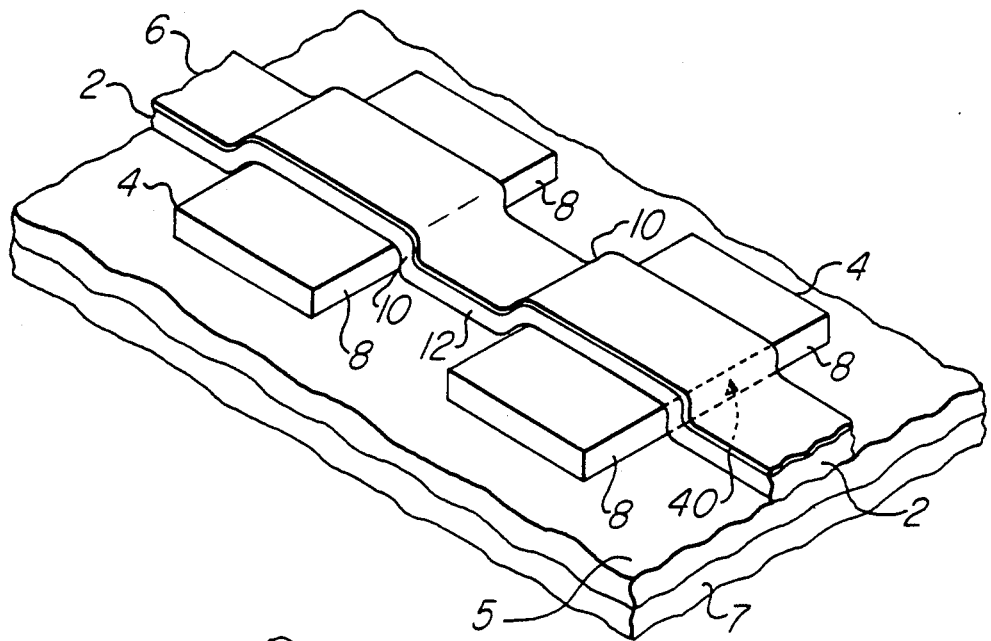
FIG. 1 illustrates a three dimensional view of a prior art mesa isolated SOI structure.
Figure 2A:
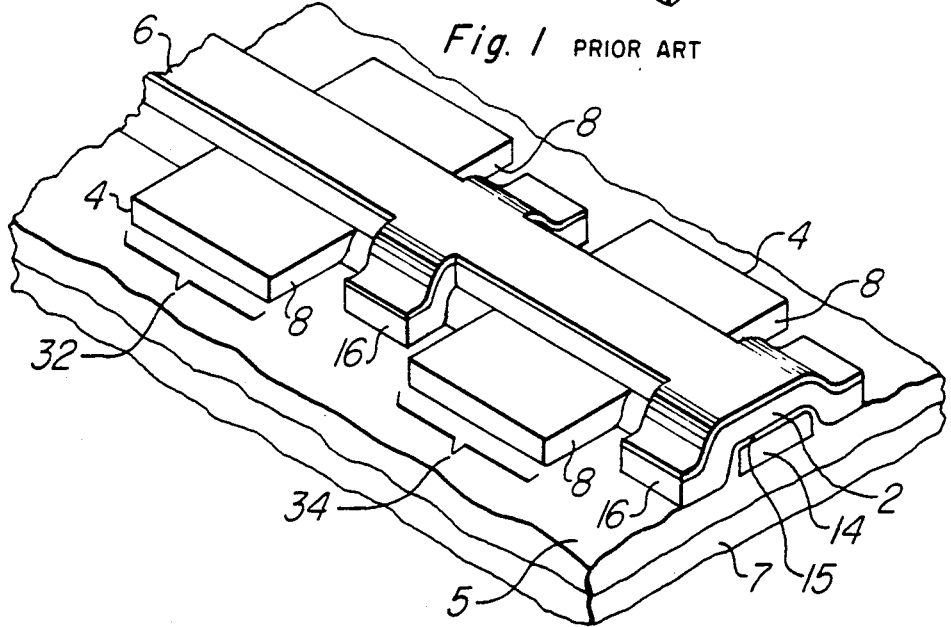
FIG. 2a illustrates a three dimensional view of the preferred embodiment of the invention.

FIG. 2a is a drawing illustrating a three dimensional view of the preferred embodiment of the invention. As shown, each mesa 4 is connected to the other by an extension of semiconductor material 14, such as silicon, which serves to provide a substantially planar surface between each mesa 4. Poly 2 is placed over the mesa. Note, that no step-like structure exists along the extent on which poly 2 is placed. Thus, silicide 6, or other metal, can be distributed over poly in such a manner which better encourages a continuous and a more even distribution of silicide 6 or other metal over poly 2. Elimination of edge leakage problems are also addressed by the structure illustrated in FIG. 2a. A threshold voltage adjust is performed by implanting dopants into the semiconductor of the mesa between transistors so as to raise the threshold voltage of the parasitic transistor on that mesa connecting the transistors built on each mesa, thereby substantially shutting off the parasitic transistor thus reducing parasitic current. Additionally, an implant with a goal toward reducing carrier mobility can be performed so as to reduce parasitic current. For instance, an implant of neutrons will damage the crystalline lattice structure of the semiconductor sufficiently to reduce carrier mobility. Alternatively, germanium can be implanted. Poly (polycrystalline) gate extension regions 32 and 34 shown in spaced apart relation, and isolation tabs 16 provide added isolation between transistors built on each mesa 4. The foregoing planar structure substantially eliminates current leakage along the edge of a mesa from source to drain as would be found on a structure without the mesa extension (for instance, along the edge indicated by arrow 40 in FIG. 1.

Figure 2B:
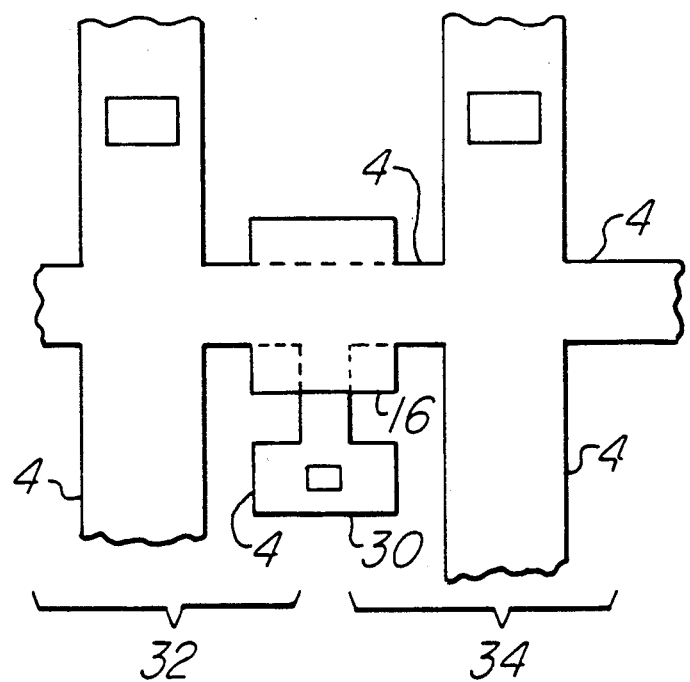
FIG. 2b illustrates a top view of an alternative embodiment of the invention.

The mesa extension between transistors can also serve as the body node of both transistors. This is a compact way to make contact to two pass transistors as, for example, in the access transistors of a static random access memory (RAM) cell. FIG. 2b illustrates a top view of such an alternative embodiment of the invention. Body node contact 30 serves to provide a common contact area to the bodies of transistor regions 32 and 34. Poly 2 is shown by the dashed lines.

Figure 2C:
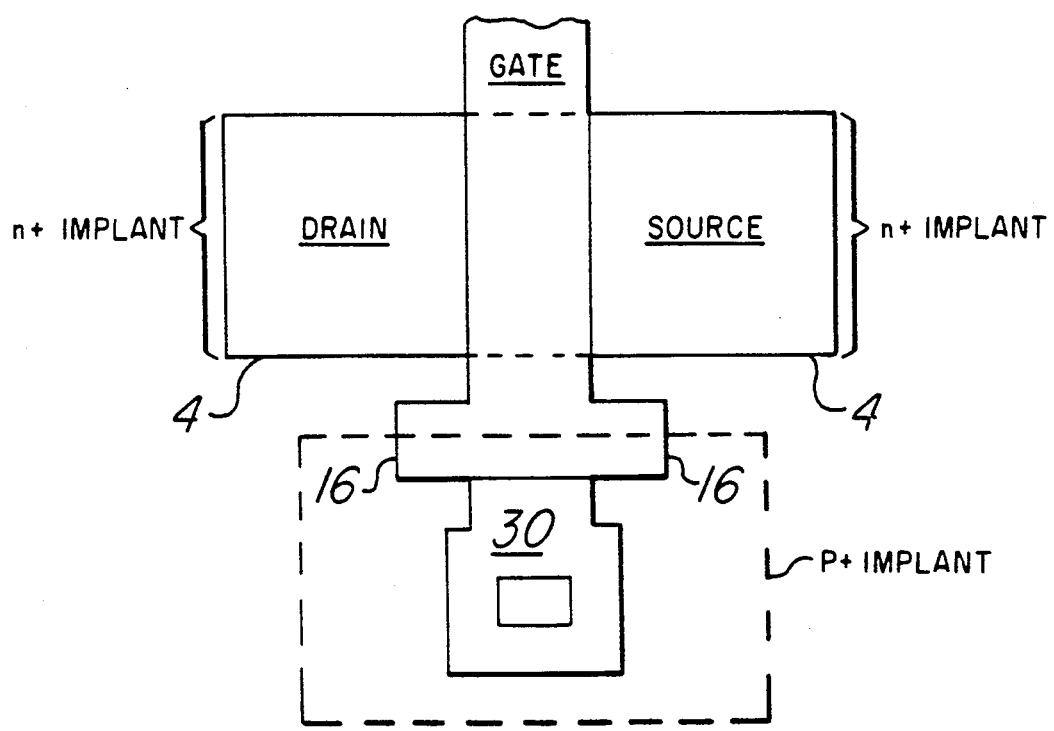
FIG. 2c illustrates a top view of another alternative embodiment of the invention.

The body contact structure can also be used with a single transistor as shown in the top view of an alternative embodiment of the invention in FIG. 2c. Poly isolational tabs 16 control the parasitic gate along the sidewall of mesa 4. Body node contact 30 is connected to the body node of the transistor by the mesa extension which lies under the transistor gate. Source and drain regions are shown in FIG. 2c. In constructing such a body node contact, a p+ (heavily doped p-type semiconductor) implant overlaps body node contact 30.

However, this implant does not extend any further than tab 16 which shields the mesa extension from the implant. The rest of the structure (assuming n-channel transistors) is given a n+ implant). For a p-channel transistor structure just the opposite dopant-type implants are used.

Figure 3:
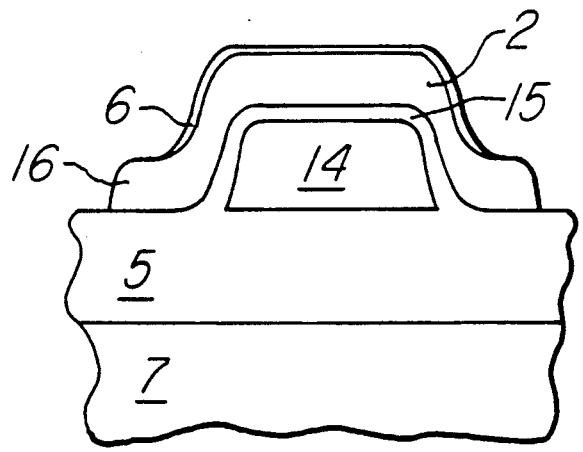
FIG. 3 illustrates a cross-sectional view of the semiconductor extension between mesas in the preferred embodiment of the invention.

FIG. 3 is a drawing which shows a cross-sectional view of semiconductor extension 14, between mesas.

Figure 4:
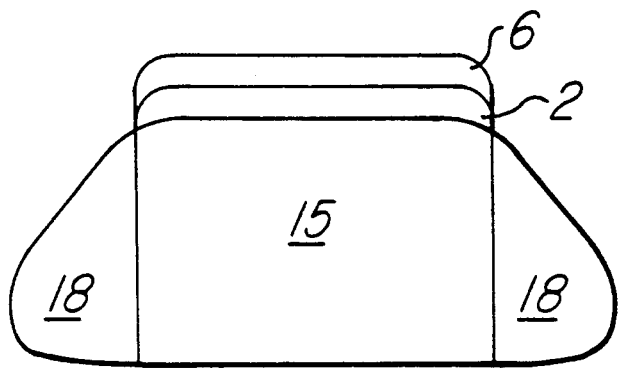
FIG. 4 illustrates a cross-sectional view of isolation tabs in the preferred embodiment of the invention.

FIG. 4 illustrates a cross-sectional view of poly tabs 16. This structure can be built along with the rest of the mesa extension in formation of the silicided polycrystalline gate to yield the layered structure shown with single crystalline semiconductor, i.e., silicon 15, under layers of poly 2 and silicide 6, flanked by an insulator such as, sidewall oxide 18.

Figure 5:
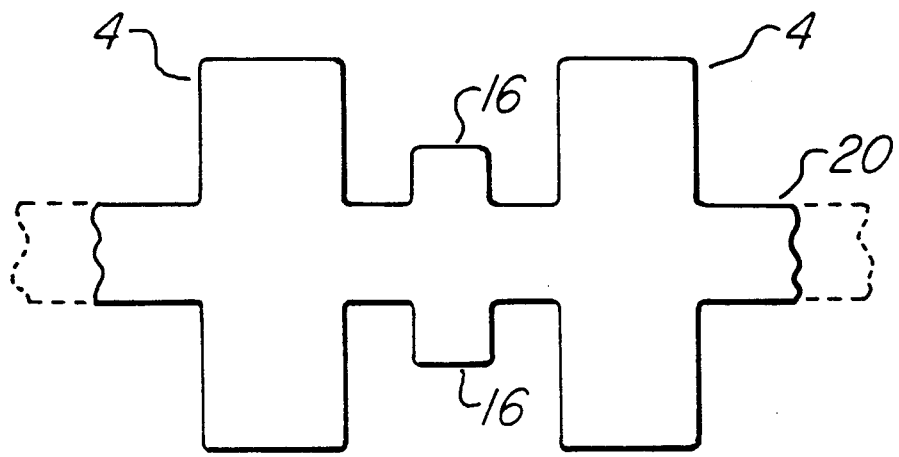
FIG. 5 illustrates a top view of the preferred embodiment of the invention.

FIG. 5 illustrates a top view of each mesa 4, the common gate 20 for the transistors formed in the mesas and tabs 16 in the preferred embodiment of the invention. As shown, it is evident that tab 16 additionally serve to isolate transistors formed in mesas 4 even in the instance where common gate 20 is misaligned relative to mesas 4.

The foregoing discussed structures can be constructed according to well known SOI field effect transistor fabrication methods. Although the invention was discussed with reference to two transistors, it is to be understood that more transistors integrated into larger circuit schemes including a common gate are contemplated for use in conjunction with the invention. For instance, the common gate previously referenced can represent a word line in a random access memory which is either dynamic or static. The tabs previously discussed can be made of the same material as the gate.

Although the invention has been described in detail herein with reference to its preferred embodiment and certain described alternatives, it is to be understood that this description is by way of example only, and is not to be construed in a limiting sense. It is to be further understood that numerous changes in the details of the embodiments of the invention, and additional embodiments of the invention, will be apparent to, and may be made by, persons of ordinary skill in the art having reference to this description. It is contemplated that all such changes and additional embodiments are within the spirit and true scope of the invention as claimed below.

I claim:

1. A transistor structure comprising:
   a commonly gated first transistor and second transistor, said transistors being formed in a thin film of semiconductor material overlying an insulator, said thin film being patterned to form a mesa for each transistor, and an extension of semiconductor material from the body node of said first transistor to the body node of said second transistor so as to form a substantially planar surface of mesa, flush with an edge abutting said common gate, underlying the common gate.

2. A transistor structure as recited in claim 1 which further comprises isolation tabs between said mesas.

3. A transistor structure as recited in claim 2 wherein said isolation tabs comprise semiconductor material flanked with a sidewall insulator.

4. A transistor structure as recited in claim 3 wherein said sidewall insulator is oxide.

5. A transistor structure as recited in claim 1 wherein parasitic current is reduced by implanting dopants into the mesa between said transistors so as to raise the threshold voltage of a parasitic transistor formed between said first and second transistors.

6. A transistor structure as recited in claim 1 wherein a body node contact is made to the mesa extension between two transistors.

* * * * *